(12) United States Patent
Tracy et al.

(10) Patent No.: US 7,546,898 B2
(45) Date of Patent: Jun. 16, 2009

(54) NOISE REDUCTION WITH RESONATANCE CHAMBER

(75) Inventors: Mark S. Tracy, Tomball, TX (US); Punan Tang, Houston, TX (US); Mohammed I. Chowdhury, Houston, TX (US); Herman A. Price, Houston, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 2 days.

(21) Appl. No.: 11/830,655

(22) Filed: Jul. 30, 2007

(65) Prior Publication Data

US 2009/0032331 A1    Feb. 5, 2009

(51) Int. Cl.
- F01N 7/04 (2006.01)
- H05K 7/20 (2006.01)
- F01N 7/08 (2006.01)
- E04F 17/04 (2006.01)

(52) U.S. Cl. .............. 181/225; 181/224; 361/696; 361/697

(58) Field of Classification Search .......... 181/225, 181/224, 226, 250, 283; 165/135, 136; 361/695, 361/696, 697
See application file for complete search history.

(56) References Cited

U.S. PATENT DOCUMENTS

| 1,715,630 | A | * | 6/1929 | Snell | 165/51 |
| 2,655,346 | A | * | 10/1953 | Dale et al. | 165/135 |
| 3,235,001 | A | * | 2/1966 | Giannotti | 165/51 |
| 3,978,919 | A | * | 9/1976 | Fachbach et al. | 165/135 |
| 4,116,269 | A | * | 9/1978 | Ikeda | 165/126 |
| 4,287,962 | A | * | 9/1981 | Ingard et al. | 181/224 |
| 4,360,075 | A | * | 11/1982 | Blaser et al. | 181/250 |
| 4,621,677 | A | * | 11/1986 | Suzuki et al. | 165/135 |
| 4,694,894 | A | * | 9/1987 | Kito et al. | 165/135 |
| 5,000,079 | A | | 3/1991 | Mardis | |
| 5,268,541 | A | * | 12/1993 | Pettersson | 181/224 |
| 5,452,362 | A | | 9/1995 | Burward-Hoy | |
| 5,572,966 | A | | 11/1996 | Doddy et al. | |
| 5,628,287 | A | | 5/1997 | Brackett et al. | |
| 5,679,931 | A | * | 10/1997 | Furse et al. | 181/224 |
| 5,931,002 | A | | 8/1999 | Nagashima | |
| 6,104,608 | A | * | 8/2000 | Casinelli et al. | 361/692 |
| 6,359,989 | B2 | | 3/2002 | Hickman et al. | |
| 6,796,402 | B1 | * | 9/2004 | Wagner | 181/238 |
| 7,389,852 | B2 | * | 6/2008 | Voss et al. | 181/255 |
| 2001/0018022 | A1 | | 8/2001 | Nakamura | |
| 2003/0173146 | A1 | * | 9/2003 | Wolf et al. | 181/224 |
| 2005/0276018 | A1 | * | 12/2005 | Moore et al. | 361/695 |
| 2007/0292261 | A1 | * | 12/2007 | Tang et al. | 415/119 |
| 2008/0065245 | A1 | * | 3/2008 | Tang et al. | 700/94 |
| 2008/0074842 | A1 | * | 3/2008 | Tracy et al. | 361/695 |

FOREIGN PATENT DOCUMENTS

| DE | 3931228 | A1 | * | 3/1990 |
| JP | 04371792 | A | * | 12/1992 |
| JP | 05071752 | A | * | 3/1993 |

OTHER PUBLICATIONS

PCT International Search Report dated Nov. 28, 2008, PCT/US2008/007604, 9 pp.

* cited by examiner

Primary Examiner—Edgardo San Martin

(57) ABSTRACT

An apparatus comprises a housing comprising an air inlet, an air outlet and a divider that divides the housing into first and second air passages. The housing comprises a resonance chamber for each air passage. Each resonance chamber comprises a port, and air waves enter each such resonance chamber through such port and resonate.

18 Claims, 2 Drawing Sheets

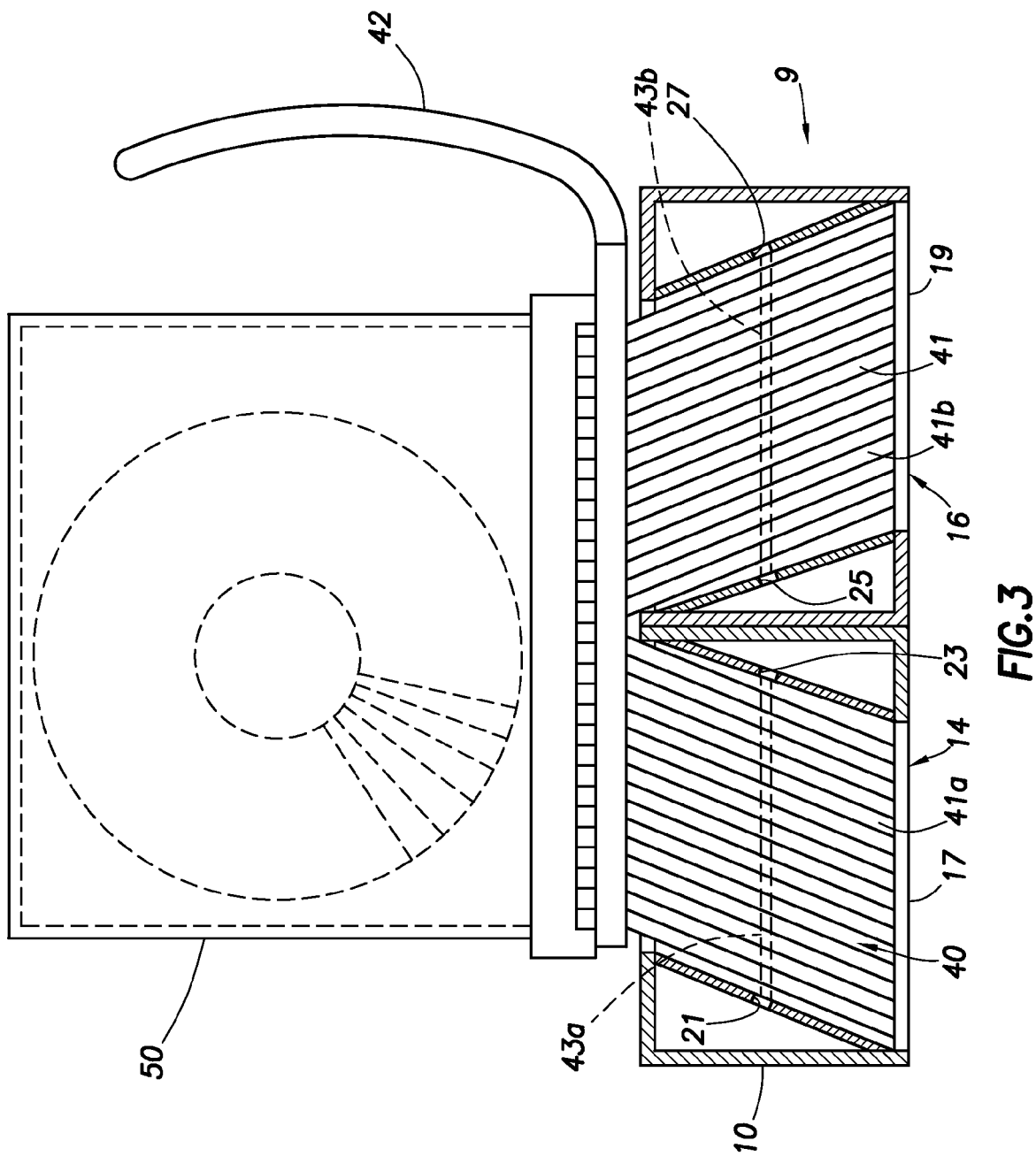

NOISE REDUCTION WITH RESONATANCE CHAMBER

BACKGROUND

Computers generate noise. A source of noise, for example, is a fan. Noise generated by a computer is generally bothersome to a user of the computer.

BRIEF DESCRIPTION OF THE DRAWINGS

For a detailed description of exemplary embodiments of the invention, reference will now be made to the accompanying drawings in which:

FIG. 3 shows an illustrative use of the apparatus of FIGS. 1 and 2 to reduce noise in accordance with various embodiments.

NOTATION AND NOMENCLATURE

Certain terms are used throughout the following description and claims to refer to particular system components. As one skilled in the art will appreciate, computer companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect, direct, optical or wireless electrical connection. Thus, if a first device couples to a second device, that connection may be through a direct electrical or mechanical connection or through an indirect electrical or mechanical connection via other devices and connections.

DETAILED DESCRIPTION

Figure 1:
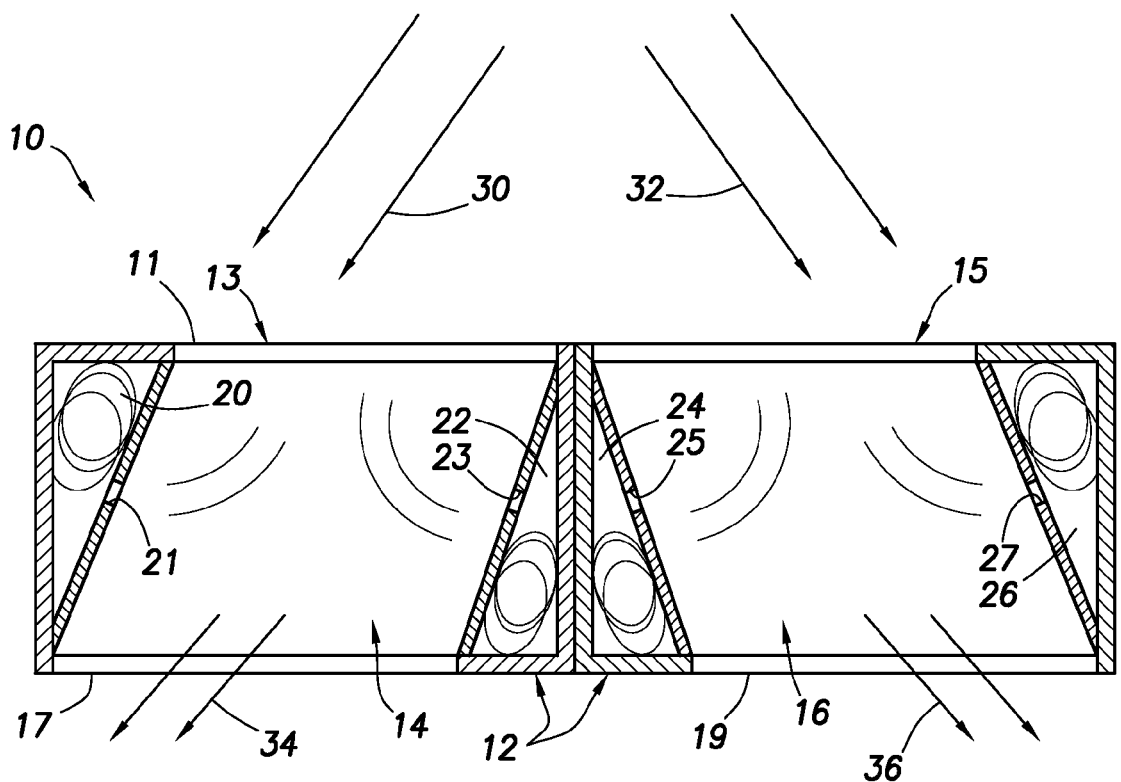
FIG. 1 shows a portion of an apparatus employing a resonance chamber to reduce noise in accordance with various embodiments.

FIG. 1 illustrates a portion 10 of a noise reduction device. The portion 10 shown in FIG. 1 comprises a housing 11. The housing 11 comprises a divider 12 that divides the housing 11 into two air passages 14 and 16. Air flows through air passages 14 and 16 as indicated by arrows 30, 32, 34 and 36. The divider 12 creates two air inlets 13 and 15 and two air outlets 17 and 19.

Figure 2:
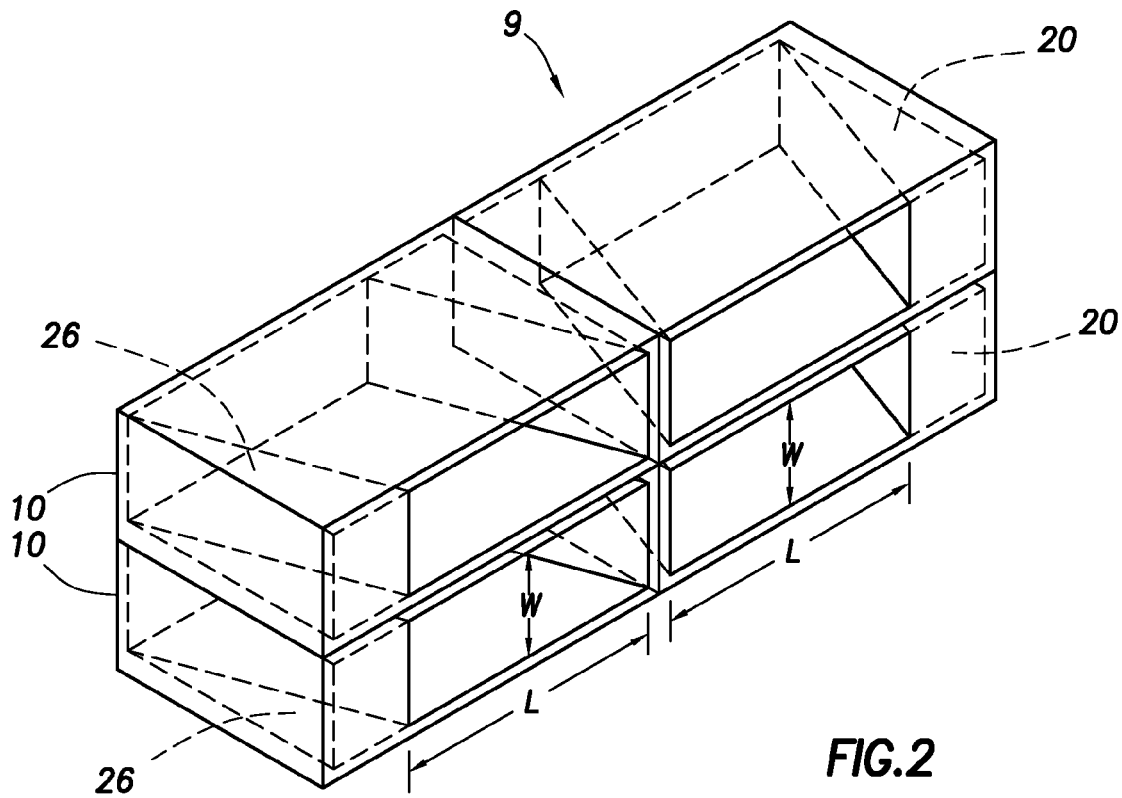
FIG. 2 shows another view of the apparatus for reducing noise in accordance with various embodiments.

FIG. 2 illustrates a complete noise reduction device 9 as comprising two portions 10 mated together. In at least some embodiments, each portion 10 is a mirror image of the other portion. When mated together, the portions 10 permit air to flow through the air passages created by the dividers 12. The two portions 10 may be mated together by welding, adhesive or other suitable mechanisms. Each portion 10 may be formed as a unitary piece of material or combined together from separately manufactured pieces.

In the embodiments of FIGS. 1 and 2, the dividers 12 create two air passages 14 and 16. In other embodiments, a divider may create more than two air passages (e.g., three air passages). In one embodiment, more than two dividers 12 may be provided in each portion 10 of the noise reduction device 9 to create three or more air passages.

In accordance with various embodiments, the housing 11 comprises at least one resonance chamber for each air passage 14, 16. In the embodiments of FIGS. 1 and 2, the housing 11 comprises two resonance chambers for each air passage 14, 16—resonance chambers 20 and 22 for air passage 14 and resonance chambers 24 and 26 for air passage 14. Although two resonance chambers are provided for each air passage 14, 16 in the embodiment of FIGS. 1 and 2, any number (1 or more) of resonance chambers can be provided for each air passage. Accordingly, any number of air passages can be provided in housing 11 and any number of resonance chambers can be provided for each air passage. In some embodiments, at least one air passage may comprise a different number of resonance chambers than another air passage in housing 11.

Each resonance chamber 20, 22, 24, and 26 comprises a port (ports 21, 23, 25, and 27, respectively) into which acoustic waves enter. Once inside the resonance chamber, the air resonates when the frequencies of the acoustical waves from the noise sources are coincident with the natural frequencies of the resonance chambers. The resonances of the air inside the resonance chambers absorb the energy of the airwaves. As a result, the noise level associated with the airflow through the noise reduction device 9 is reduced as compared to what would be the case without the noise reduction device 9.

The divider 12 comprises at least one resonance chamber, and in the illustrative embodiment of FIGS. 1 and 2, divider 12 comprises two resonance chambers 22, 24—chamber 22 being provided for reducing the noise associated with air flowing through air passage 14 and chamber 24 being provided for reducing the noise associated air flowing through air passage 16.

In accordance with various embodiments, the material of the housing defining the resonance chambers 20, 22, 24, and 26 comprises metal (e.g., aluminum, magnesium, steel, etc.), carbon, or a sufficiently rigid plastic (e.g., glass-filled plastic). "Sufficiently rigid" means the resonance chamber is such that resonance of the airwaves inside the resonance chamber can occur with enough of a Q value (a larger Q value means the air resonance peak on a frequency response curve will be higher).

Each inlet 13, 15 of the air passages 14, 16 has a length L and a width W. In accordance with various embodiments, the ratio of L to W is substantially between 1 and 2.

The resonance frequency achieved by each resonance chamber is generally a function of the size of the ports 21, 23, 25, and 27 of the resonance chambers (i.e., cross-sectional area of each port and the length of the port), as well as the interior volume of each resonance chamber. As such, the dimensions can be set so as to achieve the resonance frequency desired for a given application. In some embodiments, the size and thus the resonance frequency of one resonance chamber in the noise reduction device 9 may vary from the size and resonance frequency of another resonance chamber. If desired, all of the noise reduction device's resonance chambers may be tuned to a different frequency.

FIG. 3 illustrates an embodiment in which a heat exchanger 40 (a heat sink is also within the scope of the term heat exchanger) is used with the noise reduction device 9. The heat exchanger 40 comprises a heat exchanging member 41 coupled to a heat pipe 42. Heat from a heat producing component (e.g., processor in a computer) is channeled through the heat pipe to the heat exchanging member 41. At least a portion of the heat exchanging member 41 is contained within the housing 11 of the noise reduction device 9. As shown, portions 41a and 41b are provided in each air passage 14 and 16 of the noise reduction device 9. The portions 41a and 41b comprise one or more fins. A hole 43a and 43b is provided through each set of fins 41a and 41b, respectively. In various embodiments, the holes 43a and 43b are of the same size and align with resonance chamber ports 21, 23, 25, and 27 of the various resonance chambers 20, 22, 24, and 26 as shown. The holes 43a and 43b function as acoustic guide paths for the acoustical waves between each fin to the resonator ports 21, 23, 25, and 27. These holes 43a and 43b through the fins 41a and 41b can be circular in cross section, or can be another shape.

A fan 50 is also shown coupled to the combination of the noise reduction device 9 and heat exchanger 40. Air from the fan 50 passes through the air passages of the noise reduction device 9, is warmed by the heat of the heat exchanger 40, and exits the noise reduction device's outlets 17, 19. At the same time that the process of heat exchanging is occurring to help cool the heat-producing component coupled to the heat pipe 42, noise produced by the fan 50 is reduced by the resonance of airwaves that occurs in one or more of the resonance chambers 20, 22, 24, and 26 of the noise reduction device 9.

In some embodiments, the noise reduction device 9 is usable with a computer, or other type of electronic system. The noise reduction device may be integrated into a portable or desktop computer.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. An apparatus, comprising:
   a housing comprising an air inlet, an air outlet and a divider that divides the housing into first and second air passages; and
   a heat exchanger at least a portion of which is contained with the housing;
   wherein said housing comprises a resonance chamber for each air passage, each resonance chamber having a port, and air waves enter each such resonance chamber through said port and resonate; and
   wherein said heat exchanger defines a hole that aligns with at least one resonance chamber port.

2. The apparatus of claim 1 further comprising at least two resonance chambers associated with at least one of said first and second air passages.

3. The apparatus of claim 1 further comprising at least two resonance chambers associated with each said first and second air passages.

4. The apparatus of claim 1 wherein said divider comprises a resonance chamber.

5. The apparatus of claim 1 wherein said divider comprises a plurality of resonance chambers.

6. The apparatus of claim 1 wherein said divider divides the housing into at least first, second, and third air passages, and wherein said housing comprises a resonance chamber for each of said first, second, and third air passages.

7. The apparatus of claim 1 wherein the housing is made from a material selected from a group consisting of magnesium, aluminum, glass-filled plastic, steel, and carbon.

8. A system, comprising:
   a fan; and
   an acoustical noise reduction device coupled to said fan and comprising a plurality of air passages, each air passage comprising a resonance chamber in which airwaves resonate;
   wherein said acoustical noise reduction device comprises at least a portion of a heat exchanger, said heat exchanger having a hole that aligns with a port of said resonance chamber.

9. The system of claim 8 wherein said acoustical noise reduction device comprises a divider which creates said plurality of air passages.

10. The system of claim 9 wherein said divider comprises a resonance chamber.

11. The system of claim 9 wherein said divider comprises a plurality of resonance chambers.

12. The system of claim 9 wherein said divider divides the housing into at least first, second, and third air passages, and wherein said housing comprises a resonance chamber for each of said first, second, and third air passages.

13. The system of claim 8 wherein said acoustical noise reduction device further comprises at least two resonance chambers associated with at least one of said air passages.

14. The system of claim 8 wherein at least one resonance chamber has a resonance frequency that is different from at least one other resonance chamber.

15. An apparatus, comprising:
   means for receiving air;
   means for dividing air into first and second air passages;
   means for resonating air waves in each of said first and second air passages; and
   means for exchanging heat aligned with said means for resonating air waves.

16. The apparatus of claim 15 wherein said means for dividing is also for resonating air waves.

17. The apparatus of claim 1 wherein the housing comprises at least two resonance chambers for each air passage, and wherein the hole of the heat exchanger aligns with a port of the least two resonance chambers of at least one of the air passages.

18. The apparatus of claim 1 wherein the housing comprises two resonance chambers for each air passage, each resonance chamber having a port, and wherein the heat exchanger defines two holes, each hole of the heat exchanger aligning with ports of the resonance chambers in each air passage.

* * * * *